(12) United States Patent
Tran et al.

(10) Patent No.: US 6,734,487 B2
(45) Date of Patent: May 11, 2004

(54) MEMORY INTEGRATED CIRCUITRY WITH DRAMS USING LOCOS ISOLATIONS AND AREAS LESS THAN 6F²

(75) Inventors: Luan Tran, Meridian, ID (US); Alan R. Reinberg, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/930,787

(22) Filed: Aug. 14, 2001

(65) Prior Publication Data

US 2001/0052612 A1 Dec. 20, 2001

Related U.S. Application Data

(62) Division of application No. 08/842,230, filed on Apr. 22, 1997, now Pat. No. 6,297,129.

(51) Int. Cl.⁷ .................. H01L 27/108; H01L 29/76; H01L 29/94; H01L 31/119
(52) U.S. Cl. .................. 257/305; 257/204; 257/532
(58) Field of Search ................. 257/204, 305, 257/532

(56) References Cited

U.S. PATENT DOCUMENTS

| | | |
|---|---|---|
| 5,045,899 A | 9/1991 | Arimoto |
| 5,107,459 A | 4/1992 | Chu et al. |
| 5,350,706 A | 9/1994 | McElroy et al. |
| 5,383,151 A | 1/1995 | Onishi et al. |
| 5,469,383 A | 11/1995 | McElroy et al. |
| 5,508,541 A | 4/1996 | Hieda et al. |
| 5,537,347 A | 7/1996 | Shiratake et al. |
| 5,595,928 A | 1/1997 | Lu et al. |
| 5,637,528 A | 6/1997 | Higashitani et al. |
| 5,665,623 A | 9/1997 | Liang et al. |
| 5,726,092 A | 3/1998 | Mathews et al. |
| 5,736,670 A | 4/1998 | Carbonell et al. |
| 5,747,844 A | 5/1998 | Aoki et al. |
| 5,756,390 A * | 5/1998 | Juengling et al. ........... 438/439 |
| 6,297,129 B2 | 10/2001 | Tran et al. |

FOREIGN PATENT DOCUMENTS

JP    03205868    9/1991

OTHER PUBLICATIONS

Fazan, P.C., et al., "A High-C Capacitor (20.4.fF/um sq) with Ultrathin CVD-Ta2O5 Films Deposited on Rugged Poly-Si for High Density DRAMs", 1992, IEDM 92, pp. 263-266.*

Fazan et al., "A Highly Manufacturable Trench Isolation Process for Deep Submicron DRAMs," ©1993 IEEE, 4 pages.

(List continued on next page.)

Primary Examiner—Wael Fahmy
Assistant Examiner—Howard Weiss
(74) Attorney, Agent, or Firm—Wells St. John P.S.

(57) ABSTRACT

Memory integrated circuitry includes an array of memory cells formed over a semiconductive substrate and occupying area thereover, at least some memory cells of the array being formed in lines of active area formed within the semiconductive substrate which are continuous between adjacent memory cells. Adjacent memory cells are isolated from one another relative to the continuous active area formed therebetween by a conductive line formed over said continuous active area between said adjacent memory cells. At least some adjacent lines of continuous active area within the array are isolated from one another by LOCOS field oxide formed therebetween. The respective area consumed by individual memory cells is less than 8F², where "F" is no greater than 0.25 micron.

30 Claims, 2 Drawing Sheets

OTHER PUBLICATIONS

A. Chatterjee et al., "A Shallow Trench Isolation Study for 0.25/0.18 μm CMOS Technologies and Beyond", IEEE. 1996 Symposium on VLSI Technology Digest of Technical Papers, pp. 156–157 (1996).

M. Aoki et al., "Fully Self–Aligned $6F^2$ Cell Technology for Low Cost 1Gb DRAM", IEEE 1996 Symposium on VLSI Technology Digest of Technical Papers, pp. 22–23 (1996).

J.S. Kim et al., "A Triple Level Metallization Technique for Gigabit Sealed DRAMS". VMIC Conference. Technology Development, Memory Device Business, Samsung Electronic Co., pp. 28–33 (Jun. 18–20, 1996).

B. Keeth, "A Novel Architecture for Advanced High Density Dynamic Random Access Memories", A Thesis for M.S. E.E., University of Idaho pp. 1–62 (i–vi): (May 1996).

T. Hamamoto et al., "NAND–Structured Trench Capacitor Cell Technologies for 256 Mb DRAM and Beyond". IEICE Transactions On Electronics. pp. 789–796. 1995.

M. Noguchi et al., "0.29-$μm^2$ Trench Cell Technologies for 1G–bit DRAMs with Open/Folded–Bit–Line Layout and Selective Growth Technique". 1995 Symposium on VLSI Technology Digest of Technical Papers, pp. 137–138.

V. Mathews et al., *Dry $O_2$ High Presure Field Oxidation for 0.25 μm Isolation Technology.* SSDM '95—Device and Process Technology. 2 pages.

\* cited by examiner

MEMORY INTEGRATED CIRCUITRY WITH DRAMS USING LOCOS ISOLATIONS AND AREAS LESS THAN 6F²

CROSS REFERENCE TO RELATED APPLICATION

This patent application is a Divisional Application of U.S. patent application Ser. No. 08/842,230, filed on Apr. 22, 1997, now U.S. Pat. No. 6,297,129, entitled "Memory Integrated Circuitry" and naming Luan Tran and Alan R. Reinberg as inventors, the disclosure of which is hereby incorporated herein by reference.

TECHNICAL FIELD

This invention relates generally to formation of memory integrated circuitry.

BACKGROUND OF THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the non-active (or field) area of the substrate. These regions are typically termed as "field oxide" and are formed by LOCal Oxidation of exposed Silicon, commonly known as LOCOS. One approach in forming such oxide is to cover the active regions with a layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet ($H_2O$) oxidation, typically at atmospheric pressure and at temperatures of around 1000° C., for two to four hours. This results in field oxide growth where there is no masking nitride.

However at the edges of the nitride, some oxidant also diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak". The bird's beak is a lateral extension or encroachment of the field oxide into the active areas where the devices are formed. Although the length of the bird's beak depends upon a number of parameters, the length is typically from 0.05 micron–0.15 micron per side.

This thinner area of oxide resulting from the bird's beak provides the disadvantage of not providing effective isolation in these regions, and as well unnecessarily consumes precious real estate on the semiconductor wafer. Further, as circuit density commonly referred to as device pitch falls below 1.0 micron, conventional LOCOS techniques begin to fail due to excessive encroachment of the oxide beneath the masking stack. The closeness of the masking block stacks in such instances can result in effective joining of adjacent bird's beaks, thus effectively lifting the masking stacks and resulting in no masking effect to the oxidation. To prevent this, LOCOS active area masks typically need to be spaced further apart than the minimum capable photolithographic feature dimension where such falls below 0.3 micron, especially where 2-dimensional encroachment occurs.

The problem is exemplified in FIG. 1. There illustrated is an array 10 of staggered active area regions or islands 11, 12, 13 and 14 of a dynamic random access memory array. The areas surrounding each of the subject islands would constitute LOCOS field oxide. Active area islands 11 and 13 are formed along a line 15 along which a plurality of DRAM cells are ultimately formed. Islands 12 and 14 form a part of another line along which DRAM cells of the array are formed. Dimension 16 constitutes a separation distance between adjacent lines of active area, whereas dimension 18 constitutes the separation distance between adjacent active areas in the same line.

Unfortunately, dimension 18 typically ends up being at least 1.5 times as great as dimension 16 because of the bird's beak encroachment in two directions. Specifically, the ends of the desired active areas are subjected to bird's beak oxide encroachment both from the ends of the desired active area regions as well as laterally from the sides of such regions. However at the lateral edges of the particular active area mask not at an end, such as where the arrowhead of dimension 16 in region 11 is shown contacting the active area edge, the field oxide mask is only exposed to one dimensional oxide encroachment, that being only from laterally outside. Accordingly, the degree of encroachment is not as great along the edges as at the ends of the active area masks.

The FIG. 1 illustrated layout is typically utilized to result in individual memory cells throughout the array occupying area equal to $8F^2$. A folded bit line array architecture is also utilized to provide acceptable and superior signal-to-noise performance in conjunction with the $8F^2$ cell array.

LOCOS field oxide isolation is generally accepted within the industry to fail when the minimum photolithographic feature dimension falls below 0.3 micron due to the above end-to-end encroachment. The typical alternate isolation technique in such instances is trench isolation. For example, an article by Chatterjee et al. from the 1996 Symposium On VLSI Technology Digest Of Technical Papers, at page 156, entitled, "A Shallow Trench Isolation Study For 0.25/0.18 Micron CMOS Technologies and Beyond", provides that "As high performance CMOS technology is scaled down to the current 0.35–0.25 micron generation, shallow trench isolation (STI) becomes indispensable due to its advantages compared to the conventional LOCOS-type isolation, viz. smaller channel-width encroachment, better isolation/latch-up characteristics, planar topography, and smaller junction edge capacitance." [emphasis added] In STI, trenches are formed in the semiconductive substrate and filled with oxide such that the LOCOS bird's beak is eliminated. Trench isolation does, however, have its own other processing drawbacks.

SUMMARY

In one aspect, the invention provides memory integrated circuitry having at least some individual memory cell size of less than $8F^2$, where "F" is defined as equal to one-half of minimum pitch, with minimum pitch being defined as equal to the smallest distance of a line width plus width of a space immediately adjacent said line on one side of said line between said line and a next adjacent line in a repeated pattern within the array. In one preferred implementation, adjacent memory cells are isolated from one another by field oxide where "F" is no greater than 0.25 micron. In another aspect, at least some of those memory cells of the array are formed in lines of active area which are continuous between adjacent memory cells in the line, with said adjacent memory cells being isolated from one another by a conductive line over said continuous active area between said adjacent memory cells. In yet another aspect, the invention provides the memory circuitry in the form of DRAM having word lines and bit lines, with the bit lines preferably comprising D and D* lines formed in a folded bit line architecture within the array.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
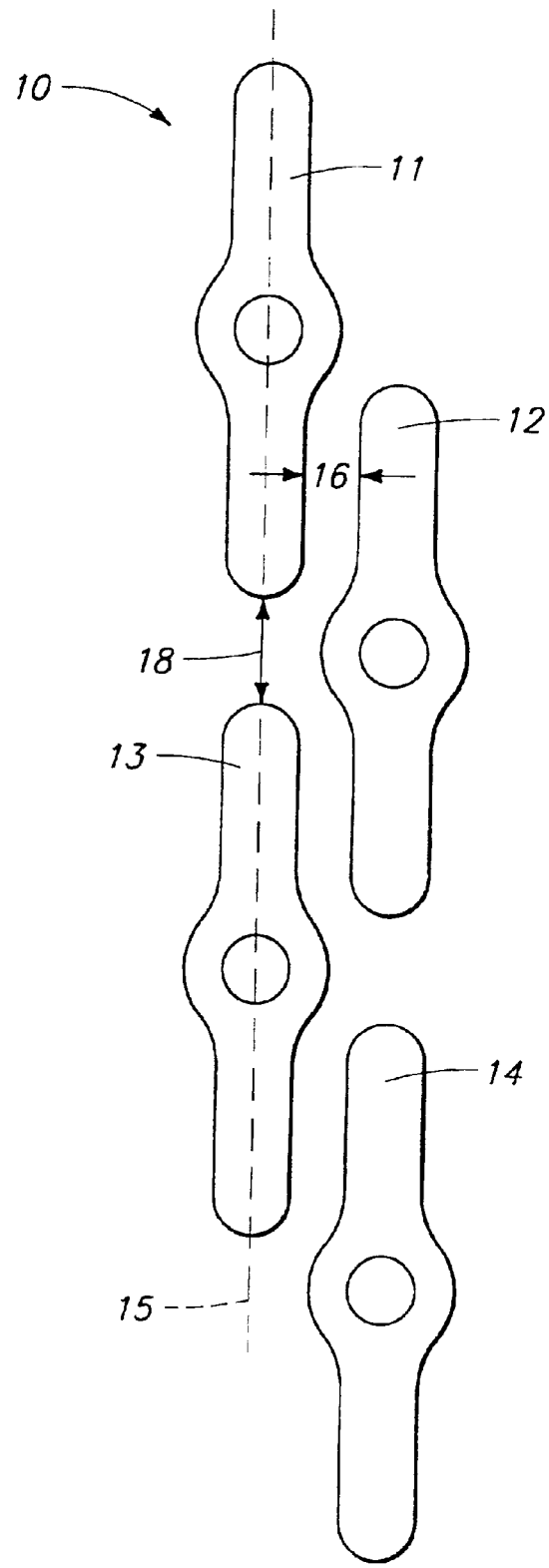
FIG. 1 is a top diagrammatic view of an active area layout of a portion of a prior art dynamic random access memory array.
Figure 2:
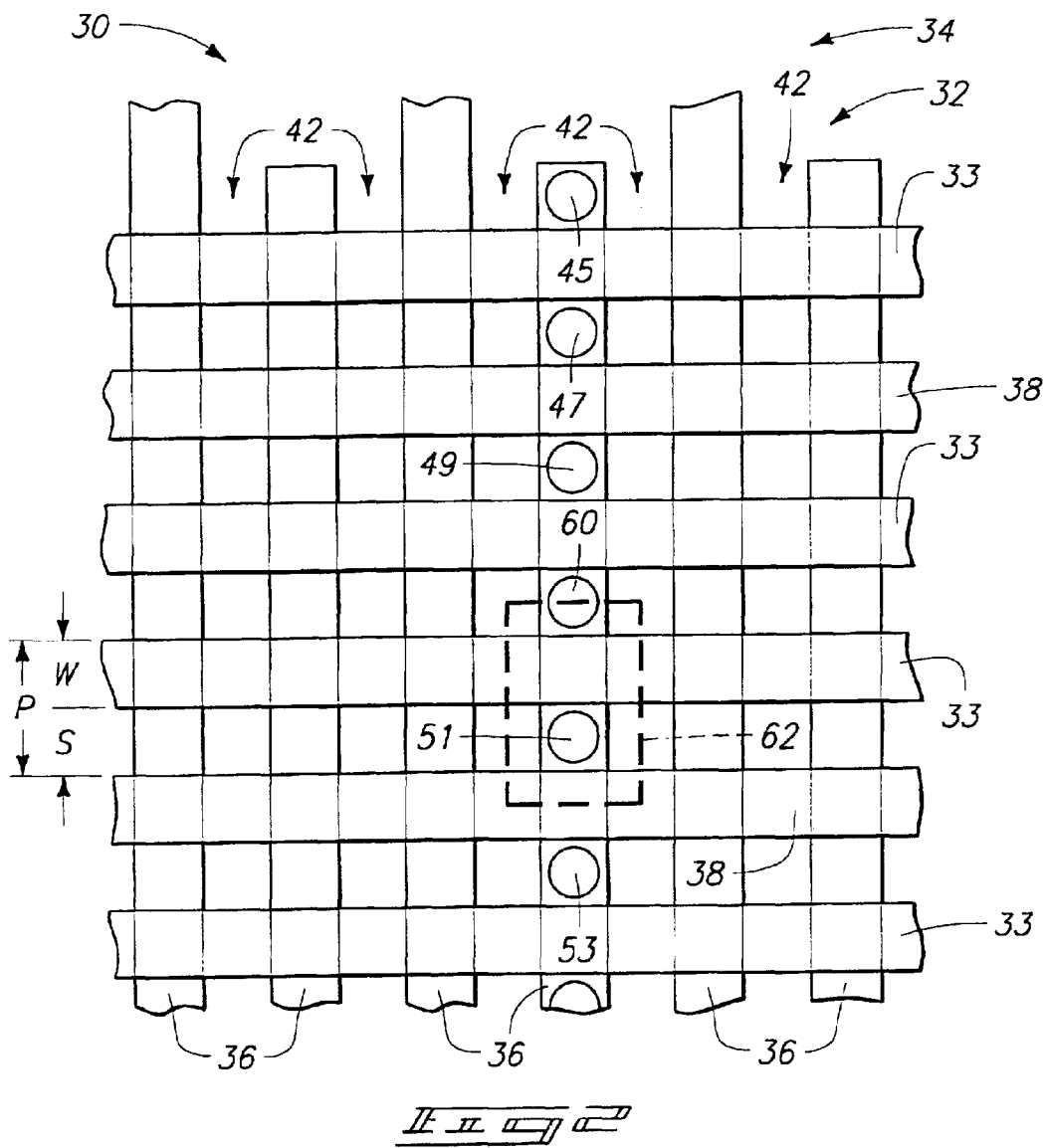
FIG. 2 is a top diagrammatic partial view of a portion of an array and peripheral circuitry thereto of dynamic random access memory circuitry in accordance with the invention.

FIG. 2 is a top view of a portion of a semiconductive substrate (such as monocrystalline silicon) illustrating memory integrated circuitry 30 comprising an array area 32 of memory cells and peripheral circuitry area 34. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An array of word lines 33 is formed over the substrate. An array of bit lines and capacitors (not shown in FIG. 2) are formed outwardly of word lines 33. Continuous lines of active area 36 are formed within the silicon substrate beneath word lines 33. Continuous active areas 36 are ideally formed in substantially straight lines throughout the array, run perpendicularly relative to word lines 33, and alternatingly extend to opposing peripheral circuitry areas, as shown. Channel stop implants (not shown) are also preferably provided between active area lines 36 to minimize cell to cell leakage.

Conductive isolation lines 38, extending substantially parallel with word lines 33, run substantially perpendicular with and are formed over continuous active area lines 36. Isolation lines 38 serve to electrically isolate immediately adjacent memory cells along a given continuous active area line within the array which do not share a common bit contact from one another. Such lines are subjected to a suitable potential, such as ground or a negative voltage, to effectively provide such isolation function. Isolation lines 38 alternate throughout the array between respective pairs of two adjacent word lines 33 between which bit contacts are formed. The illustrated word lines 33 and isolation lines 38 are ideally formed utilizing photolithography to have respective conductive widths which are less than or equal to 0.25 micron, and as well to preferably provide separation between the conductive areas of immediately adjacent lines at also less than or equal to 0.25 micron.

Further, preferably all of the continuous active area lines within the array are formed with and isolated from one another by LOCOS oxide regions 42 formed therebetween. Such are most preferably formed utilizing nitride LOCOS masking material provided by photolithography where the distance between immediately adjacent nitride masking blocks is less than or equal to 0.25 micron. The field oxide is also most desirably grown to be less than or equal to 2500 Angstroms thick to minimize bird's beak encroachment into each active area to less than or equal to 0.05 micron per side where device pitch (device width plus the space between immediately adjacent devices) is 0.4 micron or less.

Circles 45, 49, 51, and 53 represent exemplary storage node contacts for DRAM capacitors formed along one continuous active area line 36. Such are not shown in the adjacent continuous active area regions for clarity in the drawings. Circles 60 and 47 represent bit line contacts. Bit line contact 60 is shared by the two DRAM cells which utilize contacts 49 and 51 to connect active area with the respective storage nodes of the capacitors. Outline 62 represents that area consumed over the substrate by an exemplary individual memory cell of the DRAM array. Such is equal to about 3F×2F, or less, where "F" is defined as equal to one-half of minimum pitch, with minimum pitch (i.e., "P") being defined as equal to the smallest distance of a line width (i.e., "W") plus width of a space immediately adjacent said line on one side of said line between said line and a next adjacent line in a repeated pattern within the array (i.e., "S"). Thus in the preferred implementation, the consumed area of a given cell is no greater than about $6F^2$, which is less than $8F^2$. Alternately, but less preferred, the consumed area is no greater than about $7F^2$. Ideally, "F" is no greater than 0.25 micron. Utilization of continuous active area as described above facilitates limiting bird's beak encroachment to one dimension and facilitates utilization of LOCOS isolation between active area lines where "F" falls below 0.3 micron. Accordingly at "F" equal to 0.25 micron, the area consumed by most if not all individual memory cells within the array will be less than 0.5 micron$^2$, more preferably no greater than 0.4375 micron$^2$, and most preferably no greater than 0.375 micron$^2$.

Figure 3:
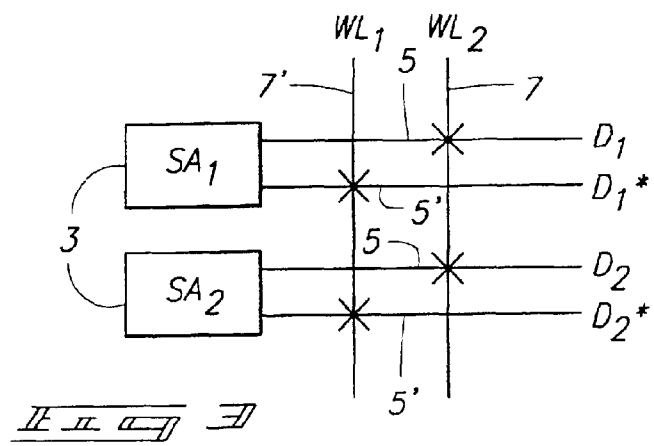
FIG. 3 is a top diagrammatic partial view utilized in the FIG. 2 array illustrating a preferred folded bit line architecture.

The preferred embodiments of the invention are ideally encompassed in a folded bit line array, such as shown in FIG. 3. Such comprises a plurality of sense amplifiers 3 having respective pairs of true "D" bit lines 5 and complement "D*" bit lines 5' extending from one side of the amplifiers. Memory cells are formed and the intersections of bit lines 5 and wordlines 7, and of bit lines 5' and word lines 7'.

U.S. patent application Ser. No. 08/530,661 listing Brent Keeth and Pierre Fazan as inventors discloses methods which can be utilized for forming the structures disclosed herein (such as, for example, dry oxidation for formation of LOCOS), and is hereby incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. Memory integrated circuitry comprising:
   an array of memory cells formed in lines over a semiconductive substrate and occupying area thereover, the respective area consumed by at least some individual memory cells within the array being equal to or less than $8F^2$, where "F" is no greater than 0.25 micron and is defined as equal to one half of minimum pitch, with minimum pitch being defined as equal to the smallest distance of a line width plus width of a space immediately adjacent said line on one side of said line between said line and a next adjacent line in a repeated pattern within the array; and
   at least some of the minimum pitch adjacent lines of memory cells within the array being isolated from one another by LOCOS field oxide formed therebetween.

2. The memory integrated circuitry of claim 1 wherein the memory cells comprise DRAM cells.

3. The memory integrated circuitry of claim 1 wherein individual ones of the lines of memory cells are substantially straight throughout the array.

4. The memory integrated circuitry of claim 1 wherein the LOCOS field oxide between adjacent lines is less than or equal to 2500 Angstroms thick.

5. The memory integrated circuitry of claim 1 wherein said respective area consumed by at least some individual memory cells within the array is no greater than about $7F^2$.

6. The memory integrated circuitry of claim 1 wherein said respective area consumed by at least some individual memory cells within the array is no greater than about $6F^2$.

7. Memory integrated circuitry comprising:
   an array of memory cells formed over a semiconductive substrate and occupying area thereover, at least some memory cells of the array being formed in lines of active area formed within the semiconductive substrate which are continuous between adjacent memory cells, said adjacent memory cells being isolated from one another relative to the continuous active area formed therebetween by a conductive line formed over said continuous active area between said adjacent memory cells;
   the respective area consumed by individual ones of said adjacent memory cells being equal to or less than $8F^2$, where "F" is no greater than 0.25 micron and is defined as equal to one half of minimum pitch, with minimum pitch being defined as equal to the smallest distance of a line width plus width of a space immediately adjacent said line on one side of said line between said line and a next adjacent line in a repeated pattern within the array; and
   at least some of the minimum pitch adjacent lines of memory cells within the array being isolated from one another by LOCOS field oxide formed therebetween.

8. The memory integrated circuitry of claim 7 wherein individual ones of the lines of continuous active area are substantially straight throughout the array.

9. The memory integrated circuitry of claim 7 wherein the LOCOS field oxide between adjacent lines is less than or equal to 2500 Angstroms thick.

10. The memory integrated circuitry of claim 7 wherein the memory cells comprise DRAM cells.

11. The memory integrated circuitry of claim 7 wherein said respective area consumed by at least some individual memory cells within the array is no greater than about $7F^2$.

12. The memory integrated circuitry of claim 7 wherein said respective area consumed by at least some individual memory cells within the array is no greater than about $6F^2$.

13. Dynamic random access memory circuitry comprising:
    an array of word lines and bit lines formed over a semiconductive substrate defining an array of DRAM cells occupying area over the semiconductive substrate, at least some DRAM cells of the array being formed in lines of active area formed within the semiconductive substrate beneath the word lines and which are continuous between adjacent DRAM cells, said adjacent DRAM cells being isolated from one another relative to the continuous active area formed therebetween by a conductive line formed over said continuous active area between said adjacent DRAM cells;
    the respective area consumed by individual ones of said adjacent memory cells being equal to or less than $8F^2$, where "F" is no greater than 0.25 micron and is defined as equal to one half of minimum pitch, with minimum pitch being defined as equal to the smallest distance of a line width plus width of a space immediately adjacent said line on one side of said line between said line and a next adjacent line in a repeated pattern within the array; and
    at least some of the minimum pitch adjacent lines of memory cells within the array being isolated from one another by LOCOS field oxide formed therebetween; and
    the bit lines comprise D and D* lines formed in a folded bit line architecture within the array.

14. The memory integrated circuitry of claim 13 wherein individual ones of the lines of continuous active area are substantially straight throughout the array.

15. The memory integrated circuitry of claim 13 wherein the LOCOS field oxide between adjacent lines is less than or equal to 2500 Angstroms thick.

16. The memory integrated circuitry of claim 13 wherein said respective area consumed by at least some individual memory cells within the array is no greater than about $7F^2$.

17. The memory integrated circuitry of claim 13 wherein said respective area consumed by at least some individual memory cells within the array is no greater than about $6F^2$.

18. Dynamic random access memory circuitry comprising:
    an array of word lines and bit lines formed over a bulk silicon semiconductive substrate defining an array of DRAM cells occupying area over the semiconductive substrate, the word lines and bit lines having respective conductive widths which are less than or equal to 0.25 micron, the DRAM cells within the array being formed in lines of active area formed within the silicon substrate beneath the word lines and which are continuous between adjacent DRAM cells, said adjacent DRAM cells being isolated from one another relative to the continuous active area formed therebetween by respective conductive lines formed over said continuous active area between said adjacent DRAM cells;
    at least some adjacent lines of continuous active area within the array being isolated from one another by LOCOS field oxide formed therebetween, said LOCOS field oxide having a thickness of no greater than 2500 Angstroms;

the respective area consumed by individual ones of said adjacent memory cells being equal to or less than 0.5 micron$^2$; and the bit lines comprise D and D* lines formed in a folded bit line architecture within the array.

19. The memory integrated circuitry of claim 18 wherein individual ones of the lines of continuous active area are substantially straight throughout the array.

20. The memory integrated circuitry of claim 18 wherein said respective area consumed by at least some individual memory cells within the array is no greater than 0.4375 micron$^2$.

21. The memory integrated circuitry of claim 18 wherein said respective area consumed by at least some individual memory cells within the array is no greater than 0.375 micron$^2$.

22. Dynamic random access memory circuitry comprising:

an array of word lines and bit lines formed over a semiconductive substrate defining an array of DRAM cells occupying area over the semiconductive substrate, at least some DRAM cells of the array being formed in lines of active area formed within the semiconductive substrate beneath the word lines and which are continuous between adjacent DRAM cells, said adjacent DRAM cells being isolated from one another relative to the continuous active area formed therebetween by a conductive line formed over said continuous active area between said adjacent DRAM cells;

the respective area consumed by individual ones of said adjacent memory cells being equal to or less than $8F^2$, where "F" is defined as equal to one half of minimum pitch, with minimum pitch being defined as equal to the smallest distance of a line width plus width of a space immediately adjacent said line on one side of said line between said line and a next adjacent line in a repeated pattern within the array; and the bit lines comprise D and D* lines formed in a folded bit line architecture within the array.

23. The memory integrated circuitry of claim 22 wherein individual ones of the lines of continuous active area are substantially straight throughout the array.

24. The memory integrated circuitry of claim 22 wherein F is no greater than 0.25 micron.

25. The memory integrated circuitry of claim 22 wherein said respective area consumed by at least some individual memory cells within the array is no greater than about $7F^2$.

26. The memory integrated circuitry of claim 22 wherein said respective area consumed by at least some individual memory cells within the array is no greater than about $6F^2$.

27. The memory integrated circuitry of claim 1 wherein the width of the space comprises less than or equal to 0.25 micron.

28. The memory integrated circuitry of claim 7 wherein the width of the space comprises less than or equal to 0.25 micron.

29. The memory integrated circuitry of claim 13 wherein the width of the space comprises less than or equal to 0.25 micron.

30. The memory integrated circuitry of claim 22 wherein the width of the space comprises less than or equal to 0.25 micron.

* * * * *